(12) United States Patent
Nakamura et al.

(10) Patent No.: US 12,160,082 B1
(45) Date of Patent: Dec. 3, 2024

(54) AIRPLANE CONFIGURED WITH A HIGH INTENSITY PULSE LASER GENERATION SYSTEM AND METHOD

(71) Applicant: Blue Laser Fusion, Inc., Palo Alto, CA (US)

(72) Inventors: Shuji Nakamura, Palo Alto, CA (US); Hiroaki Ohta, Palo Alto, CA (US)

(73) Assignee: Blue Laser Fusion, Inc., Palo Alto, CA (US)

( * ) Notice: Subject to any disclaimer, the term of this patent is extended or adjusted under 35 U.S.C. 154(b) by 207 days.

(21) Appl. No.: 18/149,984

(22) Filed: Jan. 4, 2023

(51) Int. Cl.
| | |
|---|---|
| *H01S 5/00* | (2006.01) |
| *B64D 47/02* | (2006.01) |
| *H02N 2/02* | (2006.01) |
| *G02B 5/08* | (2006.01) |
| *G02B 5/10* | (2006.01) |
| *H01S 5/323* | (2006.01) |

(52) U.S. Cl.
CPC ........... *H01S 5/0071* (2013.01); *B64D 47/02* (2013.01); *H02N 2/028* (2013.01); *G02B 5/0825* (2013.01); *G02B 5/10* (2013.01); *H01S 5/3235* (2013.01)

(58) Field of Classification Search
CPC ........ G02B 5/0825; G02B 5/10; B64D 47/02; H01S 5/0071
See application file for complete search history.

(56) References Cited

U.S. PATENT DOCUMENTS

| | | | | |
|---|---|---|---|---|
| 4,264,869 | A * | 4/1981 | Hunter | H01S 3/2308 359/349 |
| 4,345,212 | A * | 8/1982 | Seppala | H01S 3/0057 359/349 |
| 5,168,400 | A | 12/1992 | Moses | |
| 8,066,218 | B2 * | 11/2011 | Rubin | F41H 11/02 342/9 |
| 8,208,508 | B2 | 6/2012 | Deri et al. | |
| 9,171,646 | B2 | 10/2015 | Moses et al. | |
| 10,410,752 | B2 | 9/2019 | Hora | |
| 10,476,226 | B2 * | 11/2019 | Bayramian | H01S 3/1308 |
| 10,660,192 | B2 | 5/2020 | Campbell et al. | |
| 11,230,383 | B2 * | 1/2022 | Hiller | B60Q 3/41 |
| 11,387,007 | B2 * | 7/2022 | Moses | G21B 1/17 |
| 11,784,454 | B1 * | 10/2023 | Nakamura | H01S 5/3235 372/92 |
| 11,848,706 | B2 * | 12/2023 | Barrios | H04B 10/1129 |

(Continued)

FOREIGN PATENT DOCUMENTS

| | | |
|---|---|---|
| WO | 2011029031 A1 | 3/2011 |
| WO | 2012064767 A1 | 5/2012 |

(Continued)

OTHER PUBLICATIONS

Peter Russbueldt et al., "Innoslab Amplifiers", IEEE Journal of Selected Topics in Quantum Electronics, Jan./Feb. 2015, vol. 21, No. 1, pp. 447-463, Art No. 3100117, doi: 10.1109/JSTQE.2014.2333234.

(Continued)

*Primary Examiner* — Brian M O'Hara
(74) *Attorney, Agent, or Firm* — Richard T. Ogawa; Ogawa P.C.

(57) ABSTRACT

In an example, the present invention provides an airplane or aerospace vehicle system configured with a high intensity pulse laser generation system.

20 Claims, 10 Drawing Sheets

(56) References Cited

U.S. PATENT DOCUMENTS

| | | |
|---|---|---|
| 2003/0002610 A1 | 1/2003 | Panarella |
| 2009/0000268 A1 | 1/2009 | Yurash |
| 2011/0235669 A1 | 9/2011 | Deri et al. |
| 2011/0261919 A1 | 10/2011 | Sefcik et al. |
| 2013/0064340 A1 | 3/2013 | Latkowski et al. |
| 2014/0138359 A1 | 5/2014 | Carr et al. |
| 2014/0348283 A1 | 11/2014 | Perkins et al. |
| 2018/0211732 A1 | 7/2018 | Perkins |

FOREIGN PATENT DOCUMENTS

| | | |
|---|---|---|
| WO | 2013070683 A1 | 5/2013 |
| WO | 2013133885 A1 | 9/2013 |
| WO | 2013165469 A2 | 11/2013 |
| WO | 2014113100 A2 | 7/2014 |
| WO | 2014130127 A2 | 8/2014 |
| WO | 2014160128 A1 | 10/2014 |
| WO | 2015021403 A1 | 2/2015 |

OTHER PUBLICATIONS

Y. Hosaka et al., "Mode-locked pulse oscillation of a self-resonating enhancement optical cavity" Journal of Physics: Conference Series. 1350. 10.1088/1742-6596/1350/1/012028, Oct. 2016.

\* cited by examiner

Figure 2A

| Materials | Giant magnetostrictive materials | | Piezo materials |
|---|---|---|---|
| | $Tb_{0.3}Dy_{0.7}Fe_{1.9}$ | $SmFe_2$ | |
| expansion coefficient $\Delta l/l$ [ppm] (at magnetic field = 1 kOe) | 1,500 | ~750 | 800 |
| Sound speed [m/sec] | 2,200 | 2,500 | - |
| Induced stress [kg/cm²] | 300 | 240 | 150 |
| Curie temperature [degrees Celsius] | 380±40 | 405 | 180±100 |
| Response time | nanosecond~millisecond | | ~millisecond |

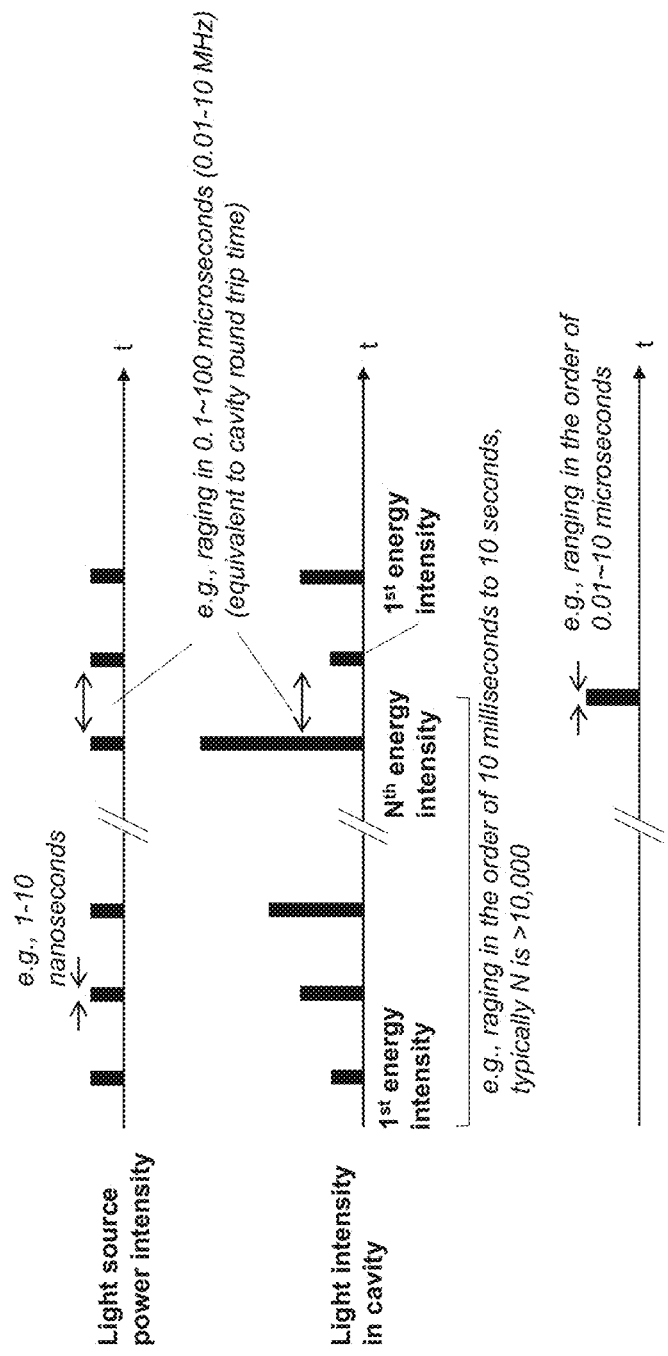

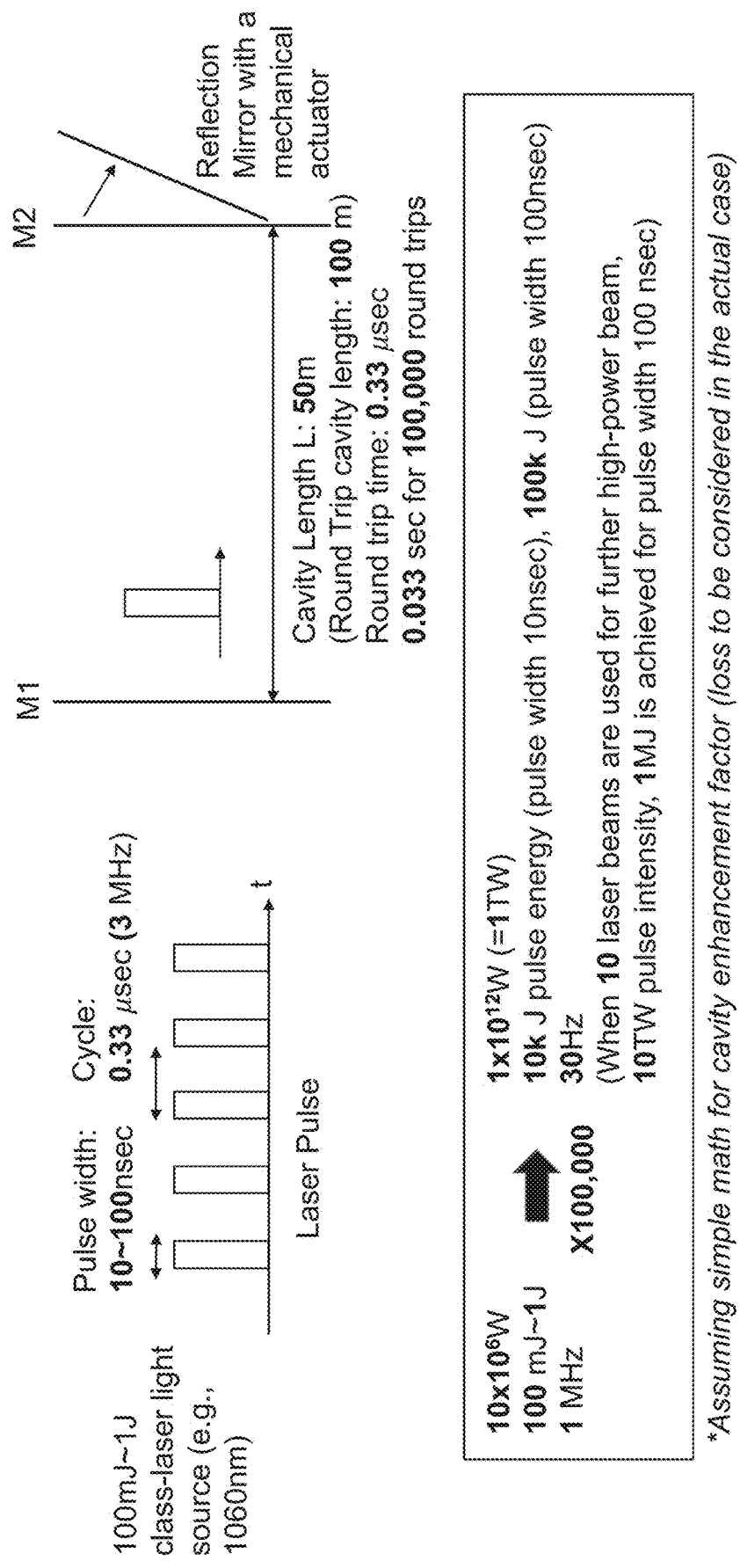

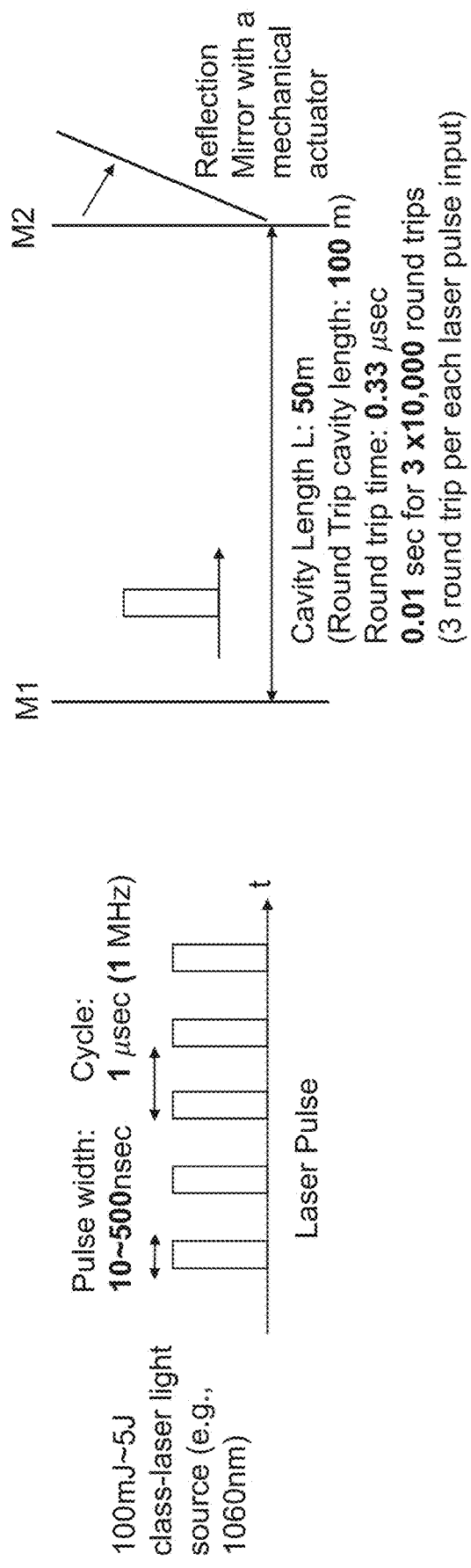

AIRPLANE CONFIGURED WITH A HIGH INTENSITY PULSE LASER GENERATION SYSTEM AND METHOD

CROSS REFERENCE TO RELATED APPLICATIONS

This application is related to U.S. Provisional Patent Application 63/424,779, filed on Nov. 11, 2022, commonly assigned, and hereby incorporated in its entirety for all purposes.

BACKGROUND OF INVENTION

The present invention relates generally to high intensity pulse laser generation techniques. In particular, the present invention provides a high intensity pulse laser generation system, and related methods configured on an airplane. Merely by way of example, the invention can also be applied to a variety of other applications, including material processing, fabrication, detector and sensing, accelerator (e.g., high-power laser pulse for particle acceleration), X-ray or other high energy radiation/particle generation (e.g., laser collision with other particles generating high energy particles), neutron generator though laser fusion reaction, other energy applications (e.g., energy generation for power, space ships, travel, other air, land, and water vehicles), defense applications (e.g., satellite, aerospace, land and missile defense, submarines, boats), biotechnology, chemical, mechanical, electrical, and communication and/or data applications.

Conventional airplanes or jets are aircraft that have been used for defense and war applications. These planes are designed for a variety of military missions, including air-to-air combat, air-to-ground attack, intelligence gathering, and air defense. They are typically equipped with a variety of weapons and other systems, such as missiles, bombs, and electronic countermeasures, which are used to engage and defeat enemy targets.

The history of military airplanes dates back to the early 20th century, when they were first used in World War I. Since then, military aviation technology has advanced rapidly, leading to the development of a wide variety of aircraft types, including fighters, bombers, and transport planes. These aircraft have played a crucial role in many conflicts and continue to be an important part of modern military operations.

Among others, several problems are associated with the use of conventional airplanes or jets for defense and war applications. One major issue is the high cost of acquiring and maintaining these aircraft, which can be extremely expensive due to their advanced technology and specialized capabilities. Additionally, conventional airplanes or jets are vulnerable to various forms of attack, such as missiles and anti-aircraft fire, which can pose a significant risk to the aircraft and their crew members. Finally, the use of these aircraft in combat situations can have significant political and diplomatic consequences, which can complicate military operations and lead to unintended consequences.

From the above, it is still desired to improve airplane or flight devices with laser devices and related systems.

SUMMARY OF INVENTION

According to the present invention, techniques related generally to high intensity pulse laser generation are provided. In particular, the present invention provides a high intensity pulse laser generation system, and related methods configured on an airplane. Merely by way of example, the invention can be applied to a variety of applications, including material processing, fabrication, detector and sensing, accelerator (e.g., high-power laser pulse for particle acceleration), X-ray or other high energy radiation/particle generation (e.g., laser collision with other particles generating high energy particles), neutron generator though laser fusion reaction, other energy applications (e.g., energy generation for power, space ships, travel, other air, land, and water vehicles), defense applications (e.g., satellite, aerospace, land and missile defense, submarines, boats), biotechnology, chemical, mechanical, electrical, and communication and/or data applications.

In an example, the present invention provides an airplane or aerospace vehicle system configured with a high intensity pulse laser generation system.

In an example, the airplane or aerospace vehicle has a cockpit section, a fuselage section having a first end and a second end, the first end coupled to the cockpit section, and a tail section coupled to the second end of the fuselage section.

In an example, the airplane or aerospace vehicle has a high intensity pulse laser generation system configured in the fuselage between the first end and the second end.

In an example, the present invention provides a high intensity pulse laser generation system. The system has a variety of elements. The system has an optical cavity maintained in a vacuum, e.g., 300 Torr and less. The cavity is characterized by a length of free space, e.g., 10 meters to 100 meters and others. In an example, the optical cavity is configured to increase an intensity of a laser beam comprising a pulse from a first energy power intensity to a second higher energy power intensity propagating on a first optical path configured within the optical cavity by circulating or reciprocating at least a portion of the laser beam. The laser beam is from a light source having a pulse energy power (e.g., 0.01 Joule to 1 Mega Joule) on the first optical path.

In an example, the system has an optical path modification device coupled to the optical cavity. In an example, the optical path modification device is configured to repeatedly change a spatial direction of the laser beam propagating on the first optical path at a predetermined timing ranging from 20 milliseconds to 3 seconds, for example, with the response time from 0.01 microsecond to 30 microseconds, for example. The change in spatial direction causes the laser beam propagating on the first optical path to change a direction from the first optical path to a second optical path that is outside of the first optical path such that the optical path modification device is configured to propagate the laser beam on the second optical path generating a high intensity pulse laser beam.

In an example, the system has at least a pair of mirror devices. Each of the mirror devices has a mirror surface area, e.g., 1 cm$^2$ to 10,000 cm$^2$. The pair of mirror devices are configured with the optical path modification device and provided within the first optical path. At least one the mirror devices is configured to change a spatial position of the mirror device being coupled to the laser beam.

In an example, the system has a timing device configured with the optical path modification device and having a predetermined frequency to adjust the spatial position of the mirror device. The timing device is configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path.

In an example, the system has a spatial driver device comprising a magneto-strictive material. The spatial driver device is coupled to the timing device and the one mirror device. The spatial driver device is configured to adjust the spatial position of the mirror device by changing a thickness of a volume structure (e.g., ranging from 0.01 mm to 2 mm) including the magneto-strictive material of the spatial driver device by an expansion or contraction process to move the spatial position of the mirror device from a first position to a second position after the predetermined number of cycles.

Of course, one of ordinary skill in the art would recognize other variations, modifications, and alternatives.

Depending upon the example, the present invention can achieve one or more of these benefits and/or advantages. In an example, the present invention provides a high intensity pulse laser system in a compact and spatially efficient system and related methods for an airplane or other flight vehicle. In an example, the present invention offers advantage of size weight and cost reduction for high intensity lasers. In an example, the present invention provides an optical path modification device (e.g., cavity dumper) that is configured with a spatial driver device that is fast, efficient, lightweight, and reliable. In an example, the present airplane with high-power laser can be configured for a variety of defense applications, e.g., missile defense, satellite defense, high target defense, and others. In an example, the present laser system is lightweight, compact, and easy to deploy. These and other benefits and/or advantages are achievable with the present device and related methods. Further details of these benefits and/or advantages can be found throughout the present specification and more particularly below.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 2A is a table listing magneto-strictive and piezo materials according to examples of the present invention.

FIG. 7 is a timing diagram for generating a high intensity pulse laser in an example of the present invention.

FIGS. 8 to 9 illustrate timing diagrams showing a high intensity pulse laser output according to examples of the present invention.

DETAILED DESCRIPTION OF THE EXAMPLES

In an example, the present invention provides generally high intensity pulse laser generation techniques. In particular, the present invention provides a high intensity pulse laser generation system, and related methods configured on an airplane. Merely by way of example, the invention can be applied to a variety of other applications, including material processing, fabrication, detector and sensing, accelerator (e.g., high-power laser pulse for particle acceleration), X-ray or other high energy radiation/particle generation (e.g., laser collision with other particles generating high energy particles), neutron generator though laser fusion reaction, other energy applications (e.g., energy generation for power or propulsion, space ships, travel, other air, land, and water vehicles), defense applications (e.g., satellite, aerospace, land and missile defense, submarines, boats), biotechnology, chemical, mechanical, electrical, and communication and/or data applications.

Figure 1:
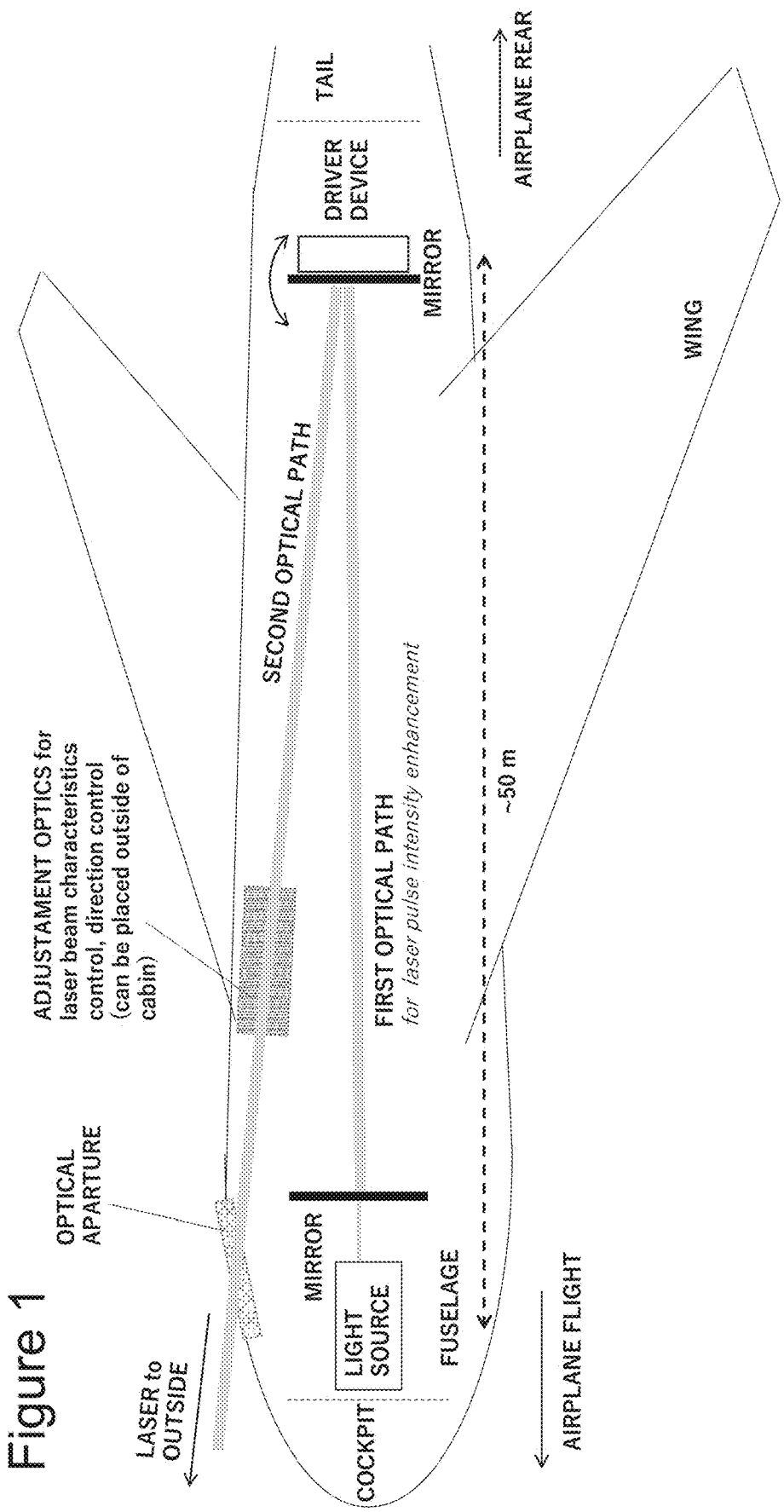
FIG. 1 is a simplified diagram illustrating an airplane configured with a high intensity pulse laser generation system according to an example of the present invention.

FIG. 1 is a simplified diagram illustrating an airplane configured with a high intensity pulse laser generation system according to an example of the present invention. In an example, the present invention provides an airplane or aerospace vehicle system configured with a high intensity pulse laser generation system. As shown, the airplane includes the high intensity pulse laser generation system. The system has a pair of mirrors opposing each other in an example. A mirror spatially disposed at a rear portion of the airplane includes a driver device, which is configured to change a path of a high intensity pulse laser beam from a first optical path to a second optical path. The second optical path includes adjustment optics for control, direction control, and other parameters. The second optical path traverses through an optical aperture to a target outside of the airplane. The mirror disposed at a front portion of the airplane is configured a laser light source, which emits electromagnetic radiation to form a laser beam that propagates between the pair of mirrors to form a resonator structure. Further details of the present invention can be found throughout the present invention and more particularly below.

In an example, the airplane can be similar to the Boeing 747 or other large cargo plane. As an example, the Boeing 747 is a long-range, wide-body commercial airliner that was first introduced in 1970. It is a four-engine, double-deck aircraft with a capacity of carrying up to 660 passengers.

In an example, the main components of a 747 airplane include:

Fuselage: This is the main body of the aircraft, which houses the passengers and crew. The 747 has a double-deck design, with the upper deck extending over the front section of the fuselage. The fuselage can also be configured for storage and equipment.

Wings: The wings of a 747 are mounted at the top of the fuselage and are used to generate lift. They are long and wide, with a distinctive swept-back shape that helps the airplane achieve high speeds.

Engines: The 747 is powered by four jet engines, which are mounted under the wings. These engines provide the power needed for the airplane to take off, climb, and cruise at high altitudes.

Landing gear: The landing gear consists of wheels and struts that support the weight of the aircraft when it is on the ground. The 747 has a distinctive landing gear configuration, with two main gear struts and a pair of nose gear struts.

Cockpit: The cockpit is located at the front of the aircraft and is where the pilots sit. It is equipped with a variety of instruments and controls that the pilots use to fly the airplane.

Passenger cabin: The passenger cabin is located inside the fuselage and is divided into several sections, including first class, business class, and economy class. Each section has its own seating arrangement and amenities. The passenger cabin can also be configured for storage and equipment.

Emergency exits: The 747 has several emergency exits located throughout the aircraft, including over-wing exits and slides that can be deployed in the event of an emergency.

Galleys and lavatories: The 747 has galleys and lavatories located throughout the cabin, which are used to prepare and serve meals and provide passengers with a place to wash their hands and use the bathroom.

Although the description above is illustrated with an airplane, other aero space vehicles or other vehicles can be included. In an example, the present system couples a high-power pulse laser system to an airplane to create a high-power energy source for defense applications.

As an example, a high-power laser is a device that produces a highly concentrated and focused beam of light with a high level of power. The light produced by a high-power laser can have a variety of properties, such as wavelength, intensity, and coherence, which depend on the specific design and construction of the laser.

One type of high-power laser is the solid-state laser, which is made of a solid gain medium that is pumped by an external energy source, such as a flashlamp or another laser. The gain medium is typically a crystal or glass rod that is doped with a rare earth element, such as neodymium or ytterbium, to amplify the laser beam. Solid-state lasers are highly efficient and can produce high-power outputs, making them ideal for many industrial and scientific applications.

Another type of high-power laser is the gas laser, which uses a gas as the gain medium. Gas lasers can be further classified based on the type of gas used, such as helium-neon lasers, carbon dioxide lasers, and argon lasers. Gas lasers are highly reliable and have a long lifespan, making them suitable for continuous operation.

A high-power laser can also be a hybrid of the two aforementioned types, such as a fiber laser, which uses a doped fiber as the gain medium. Fiber lasers are highly efficient and can produce very high-power outputs, making them ideal for many industrial and scientific applications.

There are many factors that contribute to the performance and efficiency of a high-power laser, such as the gain medium, pump source, resonator design, and cooling system. The design and construction of a high-power laser can greatly impact its performance and suitability for a specific application. As an example, a high-power laser is a highly concentrated and focused beam of light with a high level of power, used in a wide range of applications.

In an example, the present invention provides a high intensity pulse laser generation system. In an example, a high intensity pulse laser is a type of laser that produces a highly concentrated and focused beam of light with a high level of power, but with a pulse duration that is much shorter than the average pulse duration of a continuous wave laser. The short pulse duration of a high intensity pulse laser allows for high peak power and the ability to deliver energy to a target in a very short period of time.

In an example, one type of high intensity pulse laser is the Q-switched laser, which uses a mechanical or electro-optical modulator to rapidly switch the laser beam on and off. This allows the laser to produce very short pulses, with pulse durations ranging from nanoseconds to picoseconds. Q-switched lasers are highly efficient and can produce very high peak powers, making them ideal for many industrial and scientific applications. Another type of high intensity pulse laser is the mode-locked laser, which uses a nonlinear optical element, such as a saturable absorber or a passive mode locker, to generate short pulses. Mode-locked lasers can produce very short pulses, with pulse durations ranging from femtoseconds to picoseconds. They are highly stable and can produce very high peak powers, making them ideal for many scientific and research applications.

There are many factors that contribute to the performance and efficiency of a high intensity pulse laser, such as the gain medium, pump source, resonator design, and pulse generation method. The design and construction of a high intensity pulse laser can greatly impact its performance and suitability for a specific application. In an example, a high intensity pulse laser is a type of laser that produces a highly concentrated and focused beam of light with a high level of power and a very short pulse duration. It is used in a wide range of applications. In an example, the present invention provides a high intensity pulse laser generation system and related methods as described throughout the present specification and more specifically below.

Figure 2:
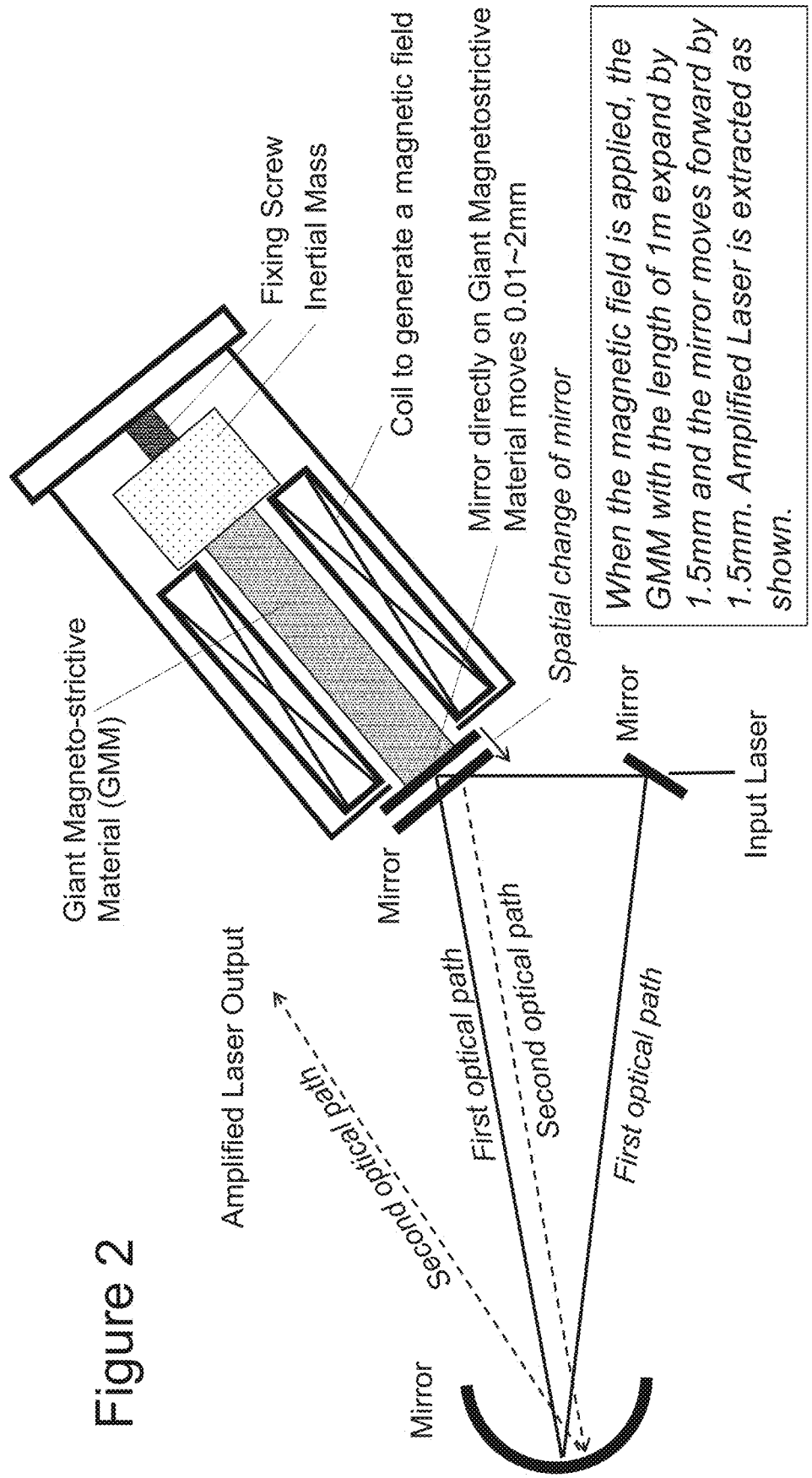
FIG. 2 is a simplified diagram of a high intensity pulse laser generation system according to an example of the present.

FIG. 2 is a simplified diagram of a high intensity pulse laser generation system according to an example of the present. As shown, the system has an input laser that is configured with a first optical path, which begins with the laser input, reflects off a mirror, coupled to an actuator, and reflects off a curved mirror back to a vicinity of the input laser to reflect off a flat mirror to form a triangular path between two flat mirrors and a curved mirror. Further details of the first optical path are provided throughout the present specification and more particularly below.

In an example, an intensity of the input laser is added to increase an intensity level of the laser beam propagating in the triangular path from a first intensity level, a second intensity level, and so on to an Nth intensity level. The intensity is increased until a desired intensity level is achieved. Once the desired intensity level has been achieved, the actuator moves the flat mirror from a first position to a second position spatially to change the beam path from the first optical path to the second optical path. In an example, the second optical path changes a spatial location of a reflection point on the mirror coupled to the actuator to direct the beam from the mirror to a reflection point on the curved mirror to an outward path for a high intensity pulse laser beam. In an example, the high intensity pulse laser beam is multiple times an intensity of the input laser beam.

As shown, the system uses both high reflection flat and curved optical mirror devices with a reflectivity of more than 99.99% or 99.999% to minimize an optical loss. In an example, a high reflection optical mirror is a device that reflects light in a specific direction. The device has a flat or curved surface, coated with a high reflective material, such as dielectric materials, or, metal materials, e.g., aluminum, silver, or gold. The preferred high reflection optical mirror is a dielectric distributed Brag Reflector (DBR). In an example, the shape and curvature of the mirror determine the direction and intensity of the reflected light.

As shown, there are several types of high reflection optical mirrors, each with specific properties and uses. Flat mirrors, also known as plane mirrors, have a flat reflecting surface and are used to reflect light in a straight line. In an example, concave mirrors have a curved inward reflecting surface and are used to focus light to a single point. In an example, convex mirrors have a curved outward reflecting surface and are used to spread out light over a wider area. In an example, optical mirrors can also be coated with specialized coatings, such as dielectric coatings or metallic coatings, to enhance their reflective properties and reduce surface defects, which causes optical absorption resulting in optical damages. These coatings can improve the efficiency and performance of the mirror, making it suitable for a specific application.

As shown, the actuator is magneto-strictive actuator in an example. In an example, a magneto-strictive actuator is a device that uses the magnetostriction effect to produce a controlled movement or displacement. The actuator has a magneto-strictive material, such as iron, cobalt, or nickel, and a magnetic field source, such as a permanent magnet or an electromagnet. A preferred example of a magnetostriction material is shown in FIG. 2A and others.

When the magneto-strictive material is subjected to a magnetic field, it experiences a change in shape or dimensions, which results in a mechanical displacement. By controlling the strength and orientation of the magnetic field, the displacement of the magneto-strictive actuator can be precisely controlled. In a preferred example, magneto-strictive actuators have a number of properties that make them well-suited for fast actuation applications. They have a high response speed, low power consumption, and a high force-to-weight ratio, which allows them to produce large displacements with minimal input power. The response time of nanoseconds is much faster than that of milliseconds of piezo materials. In addition, magneto-strictive actuators have a high fatigue resistance and can operate over a wide temperature range, making them suitable for use in a variety of environments. Magneto-strictive actuators are highly reliable and can operate continuously without the need for maintenance, making them an attractive choice for many fast actuation applications.

In an example, various factors can impact the performance and efficiency of a magneto-strictive actuator, such as the type and composition of the magneto-strictive material, the design and strength of the magnetic field source, and the mechanical design of the actuator. The specific design and construction of a magneto-strictive actuator can impact its performance and suitability for a specific application.

In an example, the actuator is coupled to an electric coil to generate a magnetic field to spatially change the magneto-strictive material. In an example, an electric coil, also known as an inductor or a solenoid, is a device that generates a magnetic field when an electric current is passed through it. The coil is generally a length of wire, typically made of copper or aluminum, wound into a cylindrical or rectangular shape. The number of turns and the diameter of the wire determine the strength of the magnetic field produced by the coil. Various factors can impact the performance and efficiency of an electric coil, such as the type and size of the wire, the number of turns, and the shape of the coil. The specific design and construction of an electric coil can greatly impact its performance and suitability for a specific application.

In an example, the actuator also has a housing, inertial mass, and fixed screw for spatial adjustments. The actuator also has a magneto-strictive material that moves 0.01 to 2 mm, in an example, but can be other lengths. The material has a flat surface that is coupled directly to a backside of the mirror surface. In a preferred example, the flat surface is roughly equal in area as the backside surface of the mirror surface. The material can be affixed using a glue, or mechanically attached on the backside surface in other examples.

Figure 3:
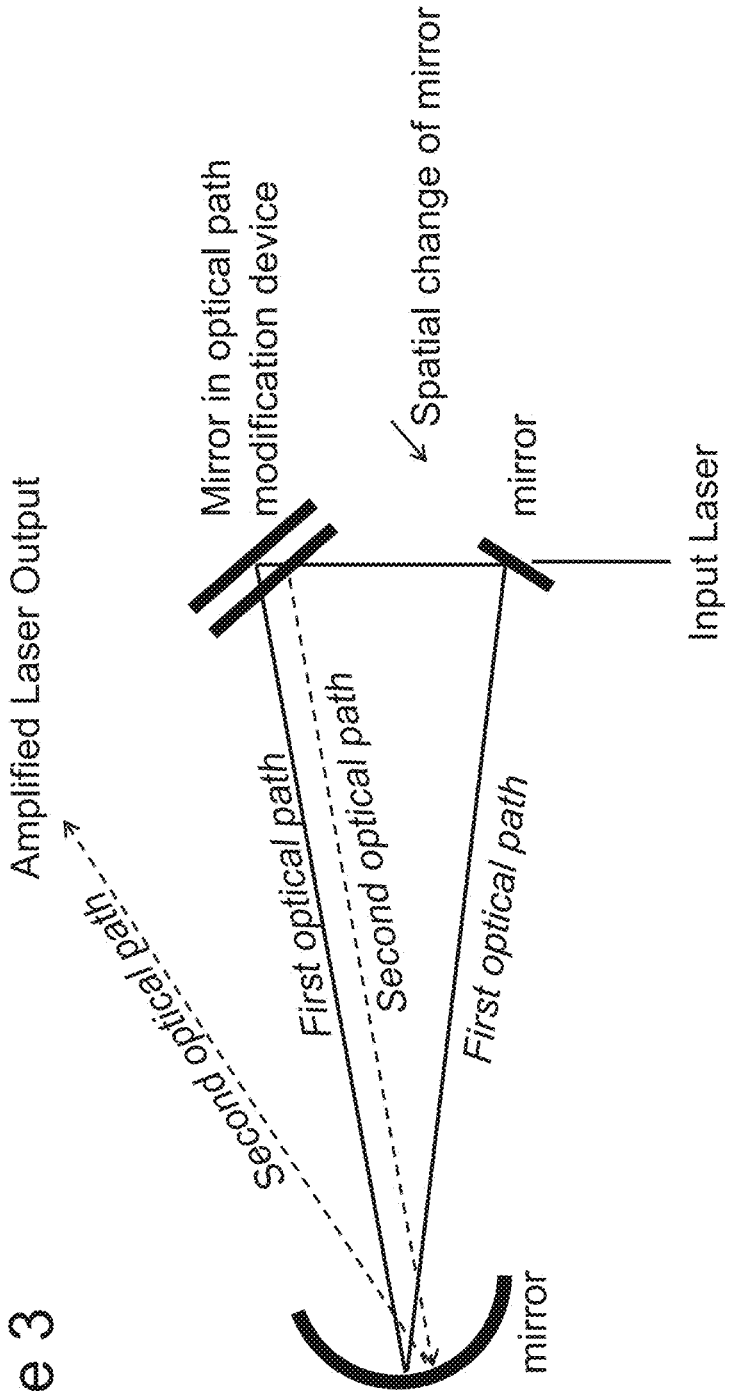
FIG. 3 is a detailed diagram of a multi path configuration for a high intensity pulse laser generation system according to an example of the present invention.

FIG. 3 is a detailed diagram of a multi path configuration for a high intensity pulse laser generation system according to an example of the present invention. As shown, the system has an input laser that is configured with a first optical path, which begins with the laser input, reflects off a mirror, coupled to an actuator, and reflects off a curved mirror back to a vicinity of the input laser to reflect off a flat mirror to form a triangular path between two flat mirrors and a curved mirror. Further details of the first optical path are provided throughout the present specification and more particularly below.

In an example, an intensity of the input laser is added to increase an intensity level of the laser beam propagating in the triangular path from a first intensity level, a second intensity level, and so on to an Nth intensity level. The intensity is increased until a desired intensity level is achieved. Once the desired intensity level has been achieved, the actuator moves the flat mirror from a first position to a second position spatially to change the beam path from the first optical path to the second optical path. In an example, the second optical path changes a spatial location of a reflection point on the mirror coupled to the actuator to direct the beam from the mirror to a reflection point on the curved mirror to an outward path for a high intensity pulse laser beam. In an example, the high intensity pulse laser beam is multiple times an intensity of the input laser beam. As shown and will be described, the various elements that make up a system for changing the beam direction from a first beam path to the second beam path are referred to as a cavity dumper. The term cavity dumper will be interpreted according to the specification, as well as meanings understood by one of ordinary skill in the art. Further details of a cavity dumper device are described in more detail below.

Figure 4:
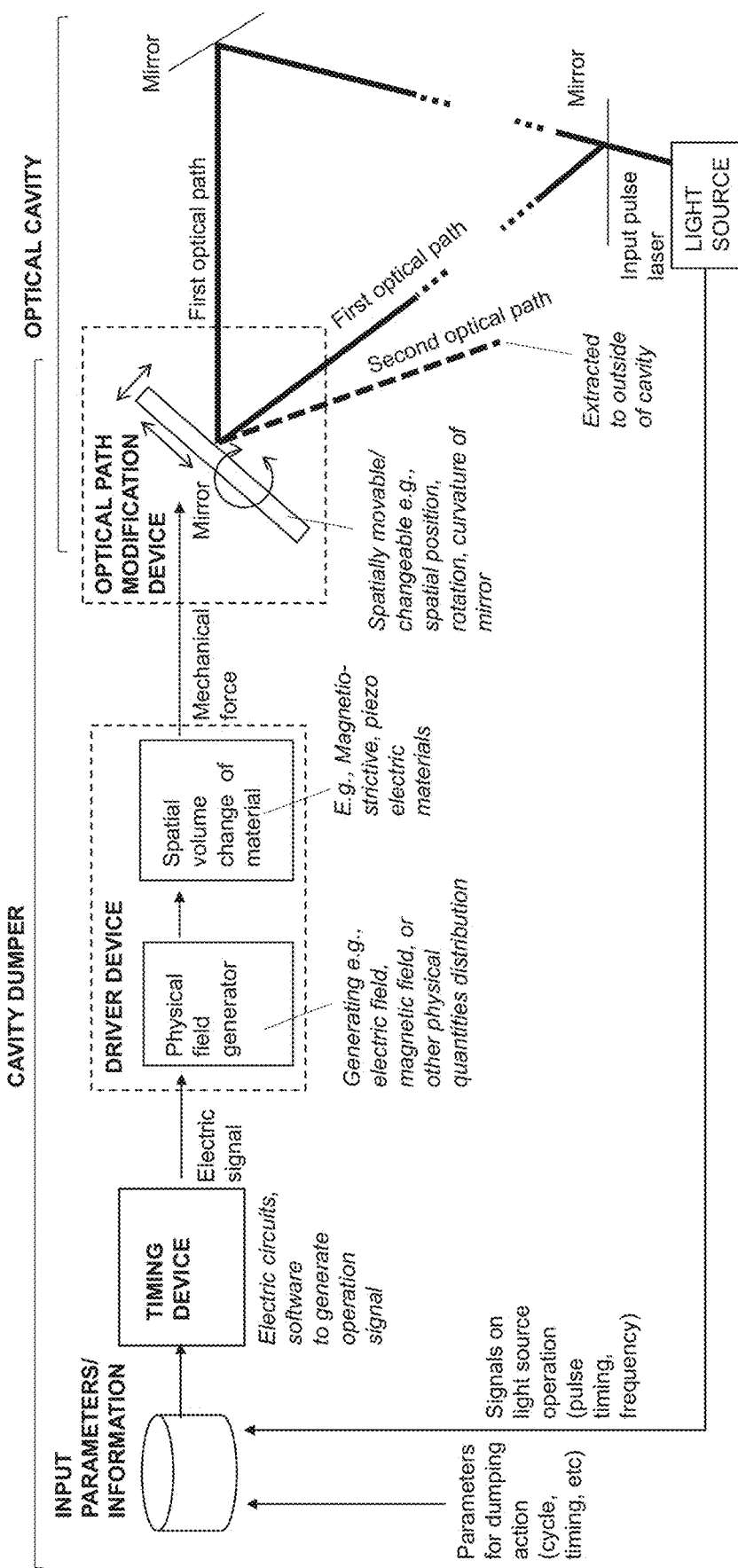
FIG. 4 is a detailed diagram of a cavity dumper for a high intensity pulse laser generation system according to an example of the present invention.

FIG. 4 is a detailed diagram of a cavity dumper for a high intensity pulse laser generation system according to an example of the present invention. As shown, the cavity dumper includes various elements including input parameters and information, a timing device, a driver device (e.g., spatial driver device), and an optical path modification device, although there may be variations. The optical path modification device is coupled to a movable mirror, a curved mirror, and a flat mirror, as shown. The spatial region configured between the mirrors creates an optical cavity, as shown. The optical cavity includes the first optical path, which generates a high intensity laser beam, and a second optical path, which outputs a high intensity pulse laser beam. The second optical path is outside of the optical cavity, as shown. In an example, the second optical path can be directed to a target. The target can be another mirror device, a particle for a reactor, a material to be processed, a moving target, e.g., vehicle, warship, drone, rocket, nuclear warhead, or any other object, whether artificial or natural or a combination thereof.

As shown, information and/or feedback from the light source are fed into a processing platform. The processing platform can be a suitable computer-based processor, controller, or other type of processor. Examples of feedback can include signals from the light source and the photodiodes to detect the transmitted light from the backside of each mirror which are not shown in FIG. 4, including pulse timing, frequency, power output, and other parameters. Parameters for cycling the mirror device are also fed into the processing platform. The processing platform further includes storage, such as volatile and non-volatile memory, including dynamic random-access memory, flash memory, static random-access memory, fixed memory devices, hard drives, and any combination of electronic and/or optical memory devices.

The information from the processing platform is fed into a timing device. The timing device is configured with a clock signal, which is configured with the information, to generate an electronic signal or signals for the driver device. The driver device includes a physical field generator that generates, for example, a magnetic field or an electric field to cause a spatial change of a spatial region in a material such as a magneto-strictive, piezo electric, or other material to output mechanical force to move a spatial position of a movable mirror. The movement of the spatial position of the mirror causes the laser beam to change from the first optical path to the second optical path, or any other optical path. In an example, the driver device can be called a spatial driver device since it drives a mechanical member in free space.

Figure 5:
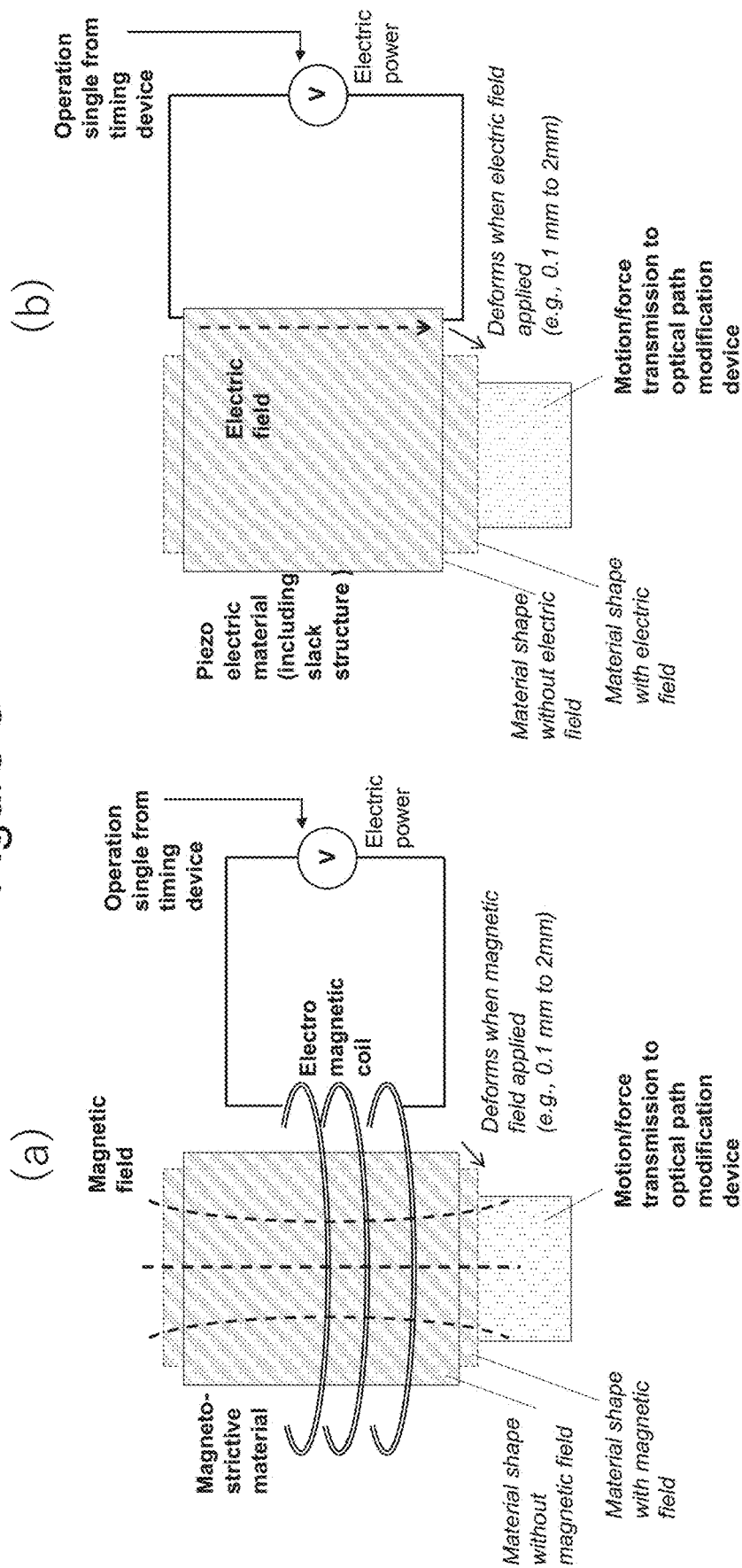
FIG. 5 is a detailed diagram of a driver device for a cavity dumper in an example of the present invention.

FIG. 5 is a detailed diagram of a driver device for a cavity dumper in an example of the present invention. As shown under FIG. 5($a$) is a magneto-strictive material configured with an electric power source. The electric power source is coupled to a timing device. The power is fed through coils to generate a magnetic field. The magnetic field changes a shape of the magneto-strictive material form a first state to a second state, which elongates the material (or contracts the materials depending on the configuration of system), and causes mechanical force to move an exterior region coupled to a mirror device from a first spatial region to a second spatial region. As shown under FIG. 5($b$) is a piezo electric material configured with an electric power source. The electric power source is coupled to a timing device. The electric power is fed to the material to generate an electric field. The electric field changes a shape of the piezo electric material form a first state to a second state, which elongates the material, and causes mechanical force to move an exterior region coupled to a mirror device from a first spatial region to a second spatial region.

Figure 6:
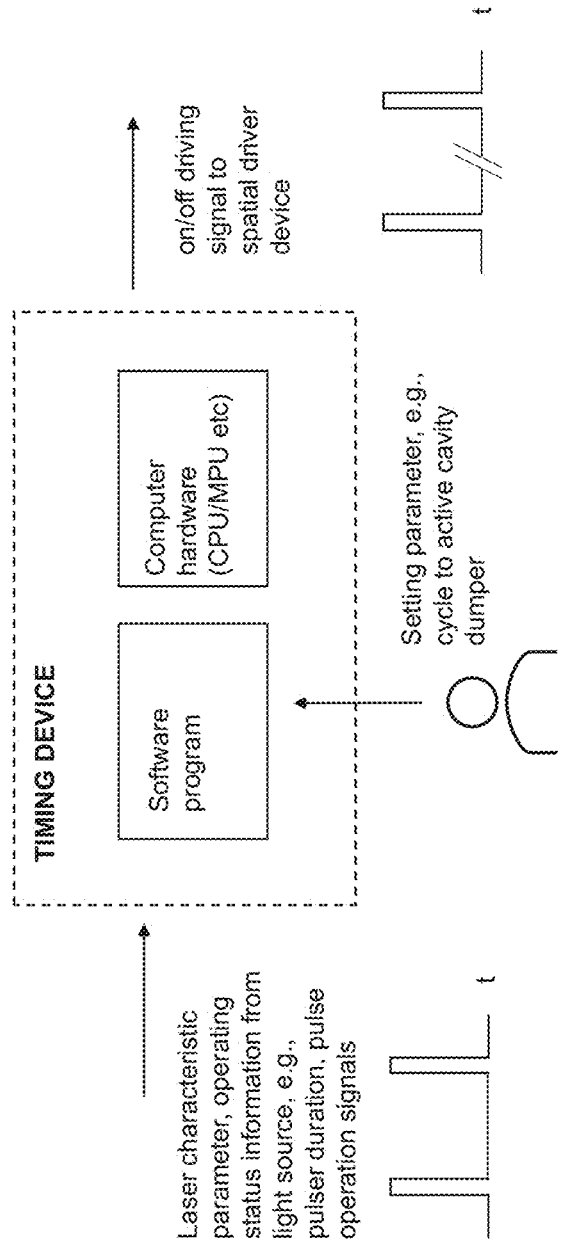
FIG. 6 is a detailed diagram of a timing device for a cavity dumper in an example of the present invention.

FIG. 6 is a detailed diagram of a timing device for a cavity dumper in an example of the present invention. As shown, the timing device receives inputs of, for example, laser characteristics, such as operating status, pulse duration, pulse operation, frequency, and other information. The timing device includes a software program, which is programmable, and computer hardware, among other elements. The timing devices outputs an on/off signal from the driver device to the magneto-strictive material or other material in an example.

In an example, a computer for controlling a drive, which is a high speed driver, also known as a "drive computer," is a specialized device that is used to control and monitor the operation of a high speed driver, such as the actuator. In an example, the drive computer typically includes a microprocessor or microcontroller, which is a type of central processing unit (CPU) that is responsible for controlling the operation of the drive. The drive computer also includes input/output (I/O) interfaces, which allow it to receive input signals from sensors or other devices and to output control signals to the drive. In an example, the drive computer may also include memory for storing data and instructions, as well as various other hardware and software components that enable it to perform its functions. Some drive computers may also include additional features, such as communication interfaces for communicating with other devices or systems, or built-in diagnostic tools for monitoring and troubleshooting the drive. Further details of the present system and method are described below.

FIG. 7 is a timing diagram for generating a high intensity pulse laser in an example of the present invention. As shown in the first line labelled "Light source power intensity," each laser pulse from the light source has a pulse in a nanosecond range, e.g., 1-10 nanoseconds. Light intensity in the cavity increases in intensity with each pulse from the source from a first energy intensity, a second energy intensity, to an Nth energy intensity, where N is 10,000 or greater, but can be fewer or more depending upon the application. Once the high intensity pulse is dumped or redirected to a second path, the process continues from the beginning with a first energy intensity, a second energy intensity to an Nth energy intensity. The cavity dumper action to dump laser beam after Nth energy intensity is achieved is illustrate on the bottom line, which shows a pulse ranging in a 0.01 to 10 microseconds range, but can be others. The laser beam that is dumped is a high intensity pulse laser that has a much higher intensity than the original intensity from the laser light source.

FIGS. 8 to 9 illustrate timing diagrams showing a high intensity pulse laser output according to examples of the present invention. As shown in an example of FIG. 8, a one hundred (100) Milli Joule class laser source is included. The laser source is configured for, for example, 1,060 nm but can be other wavelengths. The laser pulse has a length of ten (10) nanoseconds. The cycle is 0.33 micro seconds (or 3 MHz) of laser light source. In an example, one hundred thousand (100,000) cycles or round trips are generating in a cavity according to the present invention. The cavity length is, for example, fifty (50) meters equating to a round trip cavity length of one hundred (100) meters. The round trip time is 0.33 micro second, and 0.033 second creates one hundred thousand round trips. For the one hundred thousand round trips, we generate $1 \times 10^{12}$ Watts (or 1 Terra Watt) and ten (10) Kilo Joules of pulse energy at a frequency of 30 Hz. When ten (10) laser beams are used together, 10 Tera Watt (or 0.1 Mega Joule) is achieved.

For an application of defense or war, a higher pulse energy is better in an example. By increasing the duty ratio, the pulse energy is increased. By keeping the same pulse period of 0.33 μsec of the laser light source, when the pulse width is increased from 10 nano seconds to 100 nano seconds and 300 nano seconds, the pulse energy changes from 10 kilo Joules to 100 kilo Joules and 300 kilo Joules. When ten high power pulse laser systems of the present invention with the pulse width of 300 nano seconds are used together, the total pulse energy becomes 3 MJ in an example.

As shown in an example of FIG. 9, a one hundred Milli Joule class laser source is included. The laser source is configured for, for example, 1,060 nm but can be other wavelengths. The laser pulse has a length of ten (10) nanoseconds. The cycle is one (1) micro second (or 1 MHz) of laser light source. In an example, thirty thousand (30,000) cycles or round trips are generating in a cavity according to the present invention. The cavity length is, for example, fifty (50) meters equating to a round trip cavity length of one hundred (100) meters. The round-trip time is 0.33 micro seconds, and 0.01 second creates 3×10,000 round trips. For the thirty thousand round trips, we generate $1 \times 10^{11}$ Watts (or 0.1 Terra Watt) or 1 Kilo Joules of pulse energy at 100 Hz. When ten (10) laser beams are used together, 1 Tera Watt (or 10 Kilo Joule) is achieved.

In an example, for an application of defense or war, a higher pulse energy is better. By increasing the duty ratio, the pulse energy is increased. By keeping the same pulse period of 1 μsec of the laser light source, when the pulse width is increased from 10 nano seconds to 500 nano seconds and 900 nano seconds, the pulse energy becomes from 1 kilo Joules to 50 kilo Joules and 90 kilo Joules. When ten high power pulse laser systems of present invention with the pulse width of 900 nano seconds are used together, the total pulse energy becomes 900 kilo Joules in an example.

In an example, the present invention provides an airplane or aerospace vehicle system. The system has a cockpit section and a fuselage section having a first end and a second end. In an example, the first end is coupled to the cockpit section. In an example, the system has a tail section coupled to the second end of the fuselage section and a high intensity pulse laser generation system configured in the fuselage between the first end and the second end.

In an example, the high intensity pulse laser generation system has an optical cavity maintained in a vacuum. The optical cavity is configured to increase an intensity of a laser beam comprising a pulse from a first energy power intensity to a second higher energy power intensity propagating on a first optical path configured within the optical cavity by circulating or reciprocating at least a portion of the laser beam from a light source having a pulse energy power on the first optical path.

In an example, the system has an optical path modification device coupled to the optical cavity. In an example, the optical path modification device is configured to repeatedly change a spatial direction of the laser beam propagating on the first optical path at a predetermined timing with the response time to cause the laser beam propagating on the first optical path to change a direction from the first optical path to a second optical path that is outside of the first optical path thereby the optical path modification device is configured to propagate the laser beam on the second optical path generating a high intensity pulse laser beam In an example, the system has at least a pair of mirror devices, each of the mirror devices configured with the optical path modification device and provided within the first optical path, at least one the mirror devices configured to change a spatial position of the mirror device being coupled to the laser beam.

In an example, the system has a timing device configured with the optical path modification device and having a predetermined frequency to adjust the spatial position of the mirror device. The timing device is configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than to the high intensity pulse laser beam on the second optical path.

In an example, the system has a spatial driver device comprising a magneto-strictive material or a piezo electric material, the spatial driver device being coupled to the timing device and the one mirror device. The spatial driver device IS configured to adjust the spatial position of the mirror device by changing a thickness of a volume structure including the magneto-strictive material or a piezo electric material of the spatial driver device by an expansion or contraction process to move the spatial position of the mirror device from a first position to a second position after the predetermined number of cycles.

In an example, the invention includes an airplane or aerospace vehicle system. The system has a high intensity pulse laser generation system configured with the airplane or aero space vehicle system. The high intensity pulse laser generation system has an optical cavity maintained in a vacuum.

In an example, the optical cavity is configured to increase an intensity of a laser beam comprising a pulse from a first energy power intensity to a second higher energy power intensity propagating on a first optical path configured within the optical cavity by circulating or reciprocating at least a portion of the laser beam from a light source having a pulse energy power on the first optical path.

In an example, the system has an optical path modification device coupled to the optical cavity, the optical path modification device configured to repeatedly change a spatial direction of the laser beam propagating on the first optical path at a predetermined timing with the response time to cause the laser beam propagating on the first optical path to change a direction from the first optical path to a second optical path that is outside of the first optical path thereby the optical path modification device is configured to propagate the laser beam on the second optical path generating a high intensity pulse laser beam.

In an example, the present invention provides a high intensity pulse laser generation system. The system has a variety of elements. The system has an optical cavity maintained in a vacuum, e.g., 300 Torr and less. The cavity is characterized by a length of free space, e.g., 10 meters to 100 meters and others. In an example, the optical cavity is configured to increase an intensity of a laser beam comprising a pulse from a first energy power intensity to a second higher energy power intensity propagating on a first optical path configured within the optical cavity by circulating or reciprocating at least a portion of the laser beam. The laser beam is from a light source having a pulse energy power (e.g., 0.01 Joule to 1 Mega Joule) on the first optical path.

In an example, the system has an optical path modification device coupled to the optical cavity. In an example, the optical path modification device is configured to repeatedly change a spatial direction of the laser beam propagating on the first optical path at a predetermined timing ranging from 20 milliseconds to 3 seconds, for example, with the response time from 0.01 microsecond to 30 microseconds, for example. The change in spatial direction causes the laser beam propagating on the first optical path to change a direction from the first optical path to a second optical path that is outside of the first optical path such that the optical path modification device is configured to propagate the laser beam on the second optical path generating a high intensity pulse laser beam.

In an example, the system has at least a pair of mirror devices. Each of the mirror devices has a mirror surface area, e.g., 1 cm$^2$ to 10,000 cm$^2$. The pair of mirror devices are configured with the optical path modification device and provided within the first optical path. At least one the mirror devices is configured to change a spatial position of the mirror device being coupled to the laser beam.

In an example, the system has a timing device configured with the optical path modification device and having a predetermined frequency to adjust the spatial position of the mirror device. The timing device is configured to adjust the spatial position of the mirror device after a predetermined number of cycles associated with the circulating or reciprocating of the laser beam propagating between at least the pair of mirrors such that each cycle of the laser beam progressively increases an intensity from the first energy power intensity to the second energy power intensity to an Nth energy power intensity, where N is an integer greater than 2, to the high intensity pulse laser beam on the second optical path.

In an example, the system has a spatial driver device comprising a magneto-strictive material. The spatial driver device is coupled to the timing device and the one mirror device. The spatial driver device is configured to adjust the spatial position of the mirror device by changing a thickness of a volume structure (e.g., ranging from 0.01 mm to 2 mm) including the magneto-strictive material of the spatial driver device by an expansion or contraction process to move the spatial position of the mirror device from a first position to a second position after the predetermined number of cycles.

In an example, the magneto-strictive material is in mechanical contact with a backside of the mirror devices that is adjusted or monolithically integrated with the backside of the mirror device. In an example, the mechanical contact is made using a surface region of the magneto-strictive material and a backside of the mirror device, the mechanical contact between the surface region of the magneto-strictive material and the backside surface are substantially matched in area.

In an example, the change of thickness of the volume structure is spatially changed along a plane of the magneto-strictive material parallel to and facing a backside of the mirror device by modulating a magnetic field spatially with and coupled to the magnetic strictive material such that the mirror device is configured to tilt from a first angle to a second angle measured from a direction normal to the mirror surface area of the mirror device. In an example, the first angle to the second angle ranges from 0.01 degree to 5 degrees.

In an example, the magneto-strictive material or the piezo electric material is configured to move the mirror device.

In an example, the thickness of the volume structure of the magneto-strictive material is changed from a first thickness to a second thickness along an entire volume provided between a first surface region and a second surface region of the magneto-strictive material coupled to a backside of the mirror device by applying a uniform magnetic field to the magnetic strictive material such that the mirror device changes a position of the laser beam from the first optical path to the second optical path by changing a spatial location of an incidence of the laser beam on the mirror device from a first location of the mirror surface area to a second location of the mirror surface area.

In an example, the pair of mirrors comprise, respectively, a first flat mirror device and a second mirror device, the flat mirror being adjusted with the magneto-strictive material, and the second mirror device is configured with the first mirror device to change the direction of the laser beam from the first optical path to the second optical path. The second mirror device is a curved mirror device in an example. In an example, each of the mirror devices has a reflectance to the laser beam of 99.99% or more. In an example, each of the mirror devices comprises a dielectric multilayer mirror surface that includes a fluorine compound.

In an example, the optical path modification device changes an orientation of the mirror device in a time of less than 2 microseconds.

In an example, the laser beam has a wavelength range from 1,020 nm to 1,070 nm. In an example, the laser beam from the light source comprises a pulsed laser with a frequency of more than 100 kHz. In an example, the laser beam from the light source is a single-mode laser. In an example, the light source comprises a semiconductor laser light source containing an AlInGaN-based compound.

In an example, the pulse intensity of laser beam generated is at least $10^3$ times greater than a pulse intensity of the laser beam from the light source.

While the above is a full description of the specific examples, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

The invention claimed is:

1. An airplane or aerospace vehicle system, the system comprising:
    a cockpit section;
    a fuselage section having a first end and a second end, the first end coupled to the cockpit section;
    a tail section coupled to the second end of the fuselage section;
    an optical aperture coupled to the fuselage;
    a high intensity pulse laser generation system configured in the fuselage between the first end and the second end, the system comprising:
        a light source configured to generate a pulse of a laser beam having a pulse energy power of 0.01 Joule to 10 Mega Joule
        an optical cavity maintained in a vacuum of 300 Torr or less and characterized by a length of free space of 10 meters to 75 meters, the optical cavity being configured to increase an intensity of the pulse from a first energy power intensity to a second higher energy power intensity propagating on a first optical path located within the optical cavity by circulating or reciprocating the pulse along the first optical path;
        an optical path modification device coupled to the optical cavity, the optical path modification device configured to repeatedly change a spatial direction of the pulse propagating on the first optical path at a predetermined timing ranging from 20 milliseconds to 3 seconds, the optical path modification device configured to cause the pulse propagating on the first optical path to change from the first optical path to a second optical path that is outside of the first optical path, wherein the optical path modification device is configured to change a direction of the pulse to the second optical path when the pulse has reached the second higher energy density thereby generating a high intensity pulse laser beam, and a response time to change to the second optical path is from 0.01 microsecond to 30 microseconds;
        at least a pair of mirror devices, each of the mirror devices provided within the first optical path, at least one of the pair of mirror devices configured to change a spatial position of the mirror;
        a timing device configured with the optical path modification device and having a predetermined frequency to adjust the spatial position of the at least one of the pair of mirror devices, the timing device being configured to adjust the spatial position of the at least one of the pair of mirror devices after a predetermined number of cycles associated with the circulating or reciprocating of the pulse propagating between the at least pair of mirrors such that each cycle of the laser beam progressively increases an intensity from the first energy power intensity to the second energy power intensity, wherein the second energy power intensity is defined as an Nth energy power intensity;

a spatial driver device comprising a magneto-strictive material or a piezo electric material, the spatial driver device being coupled to the timing device and at least one of the pair of mirror devices, the spatial driver device being configured to adjust the spatial position of the mirror device by changing a thickness of a volume structure ranging from 0.01 mm to 2 mm by an expansion or contraction process to move the spatial position of the mirror device from a first position to a second position after the predetermined number of cycles; and wherein the second optical path traverses through the optical aperture and outside of the airplane or aerospace vehicle.

2. The system of claim 1 wherein the magneto-strictive material is in mechanical contact with a backside of the mirror devices that is adjusted or monolithically integrated with the backside of the mirror device.

3. The system of claim 2 wherein the mechanical contact of the backside of the mirror is made using a surface region of the magneto-strictive material and a backside of the mirror device, the mechanical contact between the surface region of the magneto-strictive material and the backside surface are substantially matched in area.

4. The system of claim 1 wherein the change of thickness of the volume structure is spatially changed along a plane of the magneto-strictive material parallel to and facing a backside of the mirror device by modulating a magnetic field spatially with and coupled to the magneto-strictive material such that the mirror device is configured to tilt from a first angle to a second angle measured from a direction normal to the mirror surface area of the mirror device.

5. The system of claim 4 wherein the tilt from the first angle to the second angle ranges from 0.01 degree to 5 degrees.

6. The system of claim 1 wherein the magneto-strictive material or the piezo electric material is configured to move the mirror device.

7. The system of claim 1 wherein the thickness of the volume structure of the magneto-strictive material is changed from a first thickness to a second thickness along an entire volume provided between a first surface region and a second surface region of the magneto-strictive material coupled to a backside of the mirror device by applying a uniform magnetic field to the magneto-strictive material such that the mirror device changes a position of the pulse of the laser beam from the first optical path to the second optical path by changing a spatial location of an incidence of the pulse of the laser beam on the mirror device from a first location of the mirror surface area to a second location of the mirror surface area.

8. The system of claim 1 wherein the pair of mirrors comprise, respectively, a first flat mirror device and a second mirror device, the flat mirror being adjusted with the magneto-strictive material, and the second mirror device is configured with the first mirror device to change the direction of the laser beam from the first optical path to the second optical path.

9. The system of claim 8 wherein the second mirror device is a curved mirror device.

10. The system of claim 1 wherein the pulse of the laser beam has a wavelength range from 1020 nm to 1070 nm.

11. The system of claim 1 wherein the optical path modification device changes an orientation of the mirror device in a time of less than 2 microseconds.

12. The system of claim 1, wherein each of the mirror devices has a reflectance to the laser beam of 99.99% or more.

13. The system of claim 1 wherein each of the mirror devices comprises a dielectric multilayer mirror surface that includes a fluorine compound.

14. The system of claim 1 wherein the pulse of the laser beam from the light source comprises a pulsed laser with a frequency of more than 100 kHz.

15. The system of claim 1 wherein the pulse of the laser beam from the light source is a single-mode laser.

16. The system of claim 1 wherein the light source comprises a semiconductor laser light source containing an AlInGaN-based compound.

17. The system of claim 1 wherein the pulse intensity of laser beam generated is at least 103 times greater than a pulse intensity of the laser beam from the light source.

18. An airplane or aerospace vehicle system, the system comprising:

a cockpit section;

a fuselage section having a first end and a second end, the first end coupled to the cockpit section;

an aperture coupled to the fuselage section;

a tail section coupled to the second end of the fuselage section;

a high intensity pulse laser generation system configured in the fuselage between the first end and the second end, the system comprising:

an optical cavity maintained in a vacuum, the optical cavity being configured to increase an intensity of a pulse from a laser beam from a first energy power intensity to a second higher energy power intensity propagating on a first optical path configured within the optical cavity by circulating or reciprocating the pulse from a light source having a pulse energy power on the first optical path;

an optical path modification device coupled to the optical cavity, the optical path modification device configured to repeatedly change a spatial direction of the laser beam propagating on the first optical path at a predetermined timing with the response time to cause the laser beam propagating on the first optical path to change a direction from the first optical path to a second optical path that is outside of the first optical path, wherein the optical path modification device is configured to change a direction of the pulse to the second optical path when the pulse has reached the second higher energy density thereby generating a high intensity pulse laser beam;

at least a pair of mirror devices, each of the mirror devices provided within the first optical path, at least one of the pair of mirror devices configured to change a spatial position of the mirror;

a timing device configured with the optical path modification device and having a predetermined frequency to adjust the spatial position of the at least one of the pair of mirror devices, the timing device being configured to adjust the spatial position of the at least one of the pair of mirror devices after a predetermined number of cycles associated with the circulating or reciprocating of the pulse propagating between the at least pair of mirrors such that each cycle of the laser beam progressively increases an intensity from the first energy power intensity to the second energy power intensity, wherein the second energy power intensity is defined as an Nth energy power intensity;

a spatial driver device comprising a magneto-strictive material or a piezo electric material, the spatial driver device being coupled to the timing device and at least one of the pair of mirror devices, the spatial driver device being configured to adjust the spatial position of the mirror device by changing a thickness of a volume structure by an expansion or contraction process to move the spatial position of the mirror device from a first position to a second position after the predetermined number of cycles; and wherein the second optical path traverses through the optical aperture and outside of the airplane or aerospace vehicle.

19. An airplane or aerospace vehicle system, the system comprising:

an aperture coupled to a fuselage; and a high intensity pulse laser generation system configured with the airplane or aerospace vehicle system, the high intensity pulse laser generation system comprising:

a light source configured to generate a pulse of a laser beam;

an optical cavity maintained in a vacuum, the optical cavity being configured to increase an intensity the pulse from a first energy power intensity to a second higher energy power intensity propagating on a first optical path located within the optical cavity by circulating or reciprocating the pulse on the first optical path; and an optical path modification device coupled to the optical cavity, the optical path modification device configured to repeatedly change a spatial direction of the laser beam propagating on the first optical path at a predetermined timing with the response time to cause the laser beam propagating on the first optical path to change a direction from the first optical path to a second optical path that is outside of the first optical path, wherein the optical path modification device is configured to change a direction of the pulse to the second optical path when the pulse has reached the second higher energy density thereby generating a high intensity pulse laser beam;

at least a pair of mirror devices, each of the mirror devices provided within the first optical path, at least one of the pair of mirror devices configured to change a spatial position of the mirror;

wherein the second optical path traverses through the optical aperture and outside of the airplane or aerospace vehicle.

20. The system of claim 19 further comprising:

a timing device configured with the optical path modification device and having a predetermined frequency to adjust the spatial position of the at least one of the pair of mirror devices, the timing device being configured to adjust the spatial position of the at least one of the pair of mirror devices after a predetermined number of cycles associated with the circulating or reciprocating of the pulse propagating between the at least pair of mirrors such that each cycle of the laser beam progressively increases an intensity from the first energy power intensity to the second energy power intensity, wherein the second energy power intensity is defined as an Nth energy power intensity;

a spatial driver device comprising a magneto-strictive material or a piezo electric material, the spatial driver device being coupled to the timing device and at least one of the pair of mirror devices, the spatial driver device being configured to adjust the spatial position of the mirror device by changing a thickness of a volume structure by an expansion or contraction process to move the spatial position of the mirror device from a first position to a second position after the predetermined number of cycles.

* * * * *